(12) United States Patent
Rehder

(10) Patent No.: US 11,742,442 B2
(45) Date of Patent: Aug. 29, 2023

(54) METHOD OF PROCESSING INCONSISTENCIES IN SOLAR CELL DEVICES AND DEVICES FORMED THEREBY

(71) Applicant: The Boeing Company, Chicago, IL (US)

(72) Inventor: Eric Rehder, Los Angeles, CA (US)

(73) Assignee: THE BOEING COMPANY, Arlington, VA (US)

( * ) Notice: Subject to any disclaimer, the term of this patent is extended or adjusted under 35 U.S.C. 154(b) by 0 days.

(21) Appl. No.: 17/647,839

(22) Filed: Jan. 12, 2022

(65) Prior Publication Data
US 2022/0140159 A1 May 5, 2022

Related U.S. Application Data

(62) Division of application No. 15/475,757, filed on Mar. 31, 2017, now Pat. No. 11,233,162.

(51) Int. Cl.
*H01L 31/02* (2006.01)
*H01L 31/18* (2006.01)
(Continued)

(52) U.S. Cl.
CPC .. *H01L 31/02366* (2013.01); *H01L 31/02013* (2013.01); *H01L 31/186* (2013.01);
(Continued)

(58) Field of Classification Search
CPC ........... H01L 31/0201; H01L 31/02013; H01L 31/0236; H01L 31/02366; H01L 31/118;
(Continued)

(56) References Cited

U.S. PATENT DOCUMENTS 5,277,786 A * 1/1994 Kawakami ............ H01L 31/208
136/258
6,573,445 B1 6/2003 Burgers
(Continued)

FOREIGN PATENT DOCUMENTS

CN 101048875 A 10/2007
DE 692 27 049 T2 4/1999
(Continued)

OTHER PUBLICATIONS

Notification of First Office Action issued by Chinese Patent Office dated Jul. 26, 2022 in corresponding Chinese Application No. 2018102748918 26 pages (includes English translation and Search Report).
(Continued)

*Primary Examiner* — Mayla Gonzalez Ramos
(74) *Attorney, Agent, or Firm* — MH2 Technology Law Group LLP

(57) ABSTRACT

The present disclosure is directed to a method of processing a solar cell device. The method comprises detecting at least one inconsistency at a surface of a semiconductor substrate having a solar cell active region formed therein. A deposition pattern is determined based on the location of the at least one inconsistency. A material is selectively deposited on the substrate according to the deposition pattern.

20 Claims, 7 Drawing Sheets

(51) Int. Cl.
  *H02S 50/10*    (2014.01)
  *H01L 31/0236*    (2006.01)
  *H01L 31/20*    (2006.01)

(52) U.S. Cl.
  CPC ........ *H01L 31/1876* (2013.01); *H01L 31/208* (2013.01); *H02S 50/10* (2014.12); *Y02E 10/50* (2013.01); *Y02P 70/50* (2015.11)

(58) Field of Classification Search
  CPC .............. H01L 31/186; H01L 31/1868; H01L 31/1876; H02S 50/10
  See application file for complete search history.

(56) References Cited

U.S. PATENT DOCUMENTS

| | | | |
|---|---|---|---|
| 7,989,729 | B1 | 8/2011 | Zhao et al. |
| 2006/0255340 | A1 | 11/2006 | Manivannan et al. |
| 2008/0035198 | A1 | 2/2008 | Teppe et al. |
| 2009/0301557 | A1 | 12/2009 | Agostinelli et al. |
| 2010/0124600 | A1* | 5/2010 | Basol .................... H01L 31/186 427/8 |
| 2010/0210040 | A1 | 8/2010 | Basol |
| 2010/0283126 | A1 | 11/2010 | Kiriyama et al. |
| 2011/0180128 | A1 | 7/2011 | Hwang et al. |
| 2011/0299167 | A1 | 12/2011 | Woolf |
| 2012/0329199 | A1 | 12/2012 | Kukulka |
| 2013/0186461 | A1 | 7/2013 | Kim |
| 2014/0345683 | A1* | 11/2014 | Chiu .................... H01L 31/1896 438/8 |

FOREIGN PATENT DOCUMENTS

| | | |
|---|---|---|
| JP | H06151908 A | 5/1994 |
| JP | 201384751 A | 5/2013 |
| JP | 2015505167 A | 2/2015 |
| JP | 2015050295 A | 6/2015 |
| JP | 2016520259 A | 7/2016 |
| JP | 2018063680 A | 4/2018 |
| NL | 1010635 C2 | 5/2000 |
| WO | 2009094578 A2 | 7/2009 |
| WO | 2011136659 A1 | 11/2011 |
| WO | 2013/051433 A1 | 4/2013 |
| WO | 2013096500 A1 | 6/2013 |
| WO | 2014189626 A1 | 11/2014 |
| WO | 2017002927 A | 4/2018 |

OTHER PUBLICATIONS

Communication pursuant to Article 94(3) EPC in corresponding European Application No. 18164625.8 dated Jan. 2, 2020, 8 pages.
Extended European Search Report dated Nov. 22, 2018 in corresponding European Application No. 18164625.8 (13 pages).
Extended European Search Report dated Sep. 8, 2022 in corresponding European Application No. 22175903.8 with English-language Abstract, 11 pages.
Burgers et al., "How to Design Optimal Metallization Patters for Solar Cells," Progress in Photovoltaics: Research and Application, 7, 457-461 (1999).
"Notice of Reasons for Rejection," dated Aug. 23, 2022, in corresponding Japanese Application No. 2018-063680, 6 pages (includes English translation).
Notice of Reasons for Rejection dated Mar. 15, 2022 in related Japanese Application No. 2018-063680, 4 pages (with English translation, 3 pages).
Partial European Search Report dated Aug. 1, 2018 in corresponding EP Application No. 18164625.8.
Communication pursuant to Article 94(3) EPC in corresponding European Application No. 18164625.8 dated May 26, 2021, 8 pages.

* cited by examiner

METHOD OF PROCESSING INCONSISTENCIES IN SOLAR CELL DEVICES AND DEVICES FORMED THEREBY

RELATED REFERENCES

The present disclosure is a divisional application of U.S. patent application Ser. No. 15/475,757, filed Mar. 31, 2017, now U.S. Pat. No. 11,233,162, issued on Jan. 25, 2022, the disclosure of which is incorporated herein by reference in its entirety.

FIELD OF THE DISCLOSURE

The present disclosure is directed to methods of making wiring for solar cells on semiconductor substrates comprising inconsistencies, and to devices formed by the methods.

BACKGROUND

Most solar cells include front wiring for collecting electrical current produced by the solar cell device. The front wiring is configured to have long, thin metal grid lines that terminate into bus bars. The bus bars collect large amounts of current from the grid lines and carries it to contact regions. Inconsistencies in the solar cell surface on which the wiring is formed can cause low cell performance that results from the metal wiring overlapping with inconsistencies in the semiconductor layers. For example, the inconsistencies can cause shorting and/or increase resistance of the wiring to undesirable levels. FIG. 1 shows an example of a solar cell device 8 formed on a semiconductor substrate 10. As shown in FIG. 2, semiconductor substrate 10 includes a support substrate 10a comprising germanium or silicon, a III/V single crystal device layer 10b (e.g., GaAs and/or InGaP) and front wiring 12. Semiconductor substrate 10 can have inconsistencies 14 and 16, as indicated. Inconsistency 14 is on the semiconductor substrate 10, but does not contact the front wiring 12 and thus would have little or no impact on performance. Inconsistency 16, however, is under a grid line and thus can potentially degrade solar cell performance. Inconsistencies that contact any part of the front wiring 12 may potentially degrade performance, including inconsistencies positioned under the bus bars 18, contact regions 20 or grid lines 22.

FIG. 2 shows front wiring 12 on semiconductor substrate 10 having inconsistencies 14, 16a and 16b. The inconsistencies may come in a variety of types and from a variety of sources. One type of inconsistency 16a is in the form of a particle, such as a particle that has fallen during the deposition of the solar cell material, leading to a tall, non-planar surface feature that may potentially increase the resistance of any wiring formed thereon. Another inconsistency 16b can occur as a no growth region that appears as a hole in the semiconductor substrate, which can potentially increase resistance and/or cause an electrical short between active regions of the device, thereby degrading device performance.

Various approaches are known for fabrication of the front metal wiring of solar cell devices. One common approach employs a lift-off technique to pattern metal lines. This process includes forming a patterned polymer lift-off mask on the semiconductor substrate. The lift-off mask is patterned for forming a desired solar cell wiring configuration using techniques well known in the art. The patterned lift-off mask has gaps exposing underlying portions of the substrate. A metal layer is blanket deposited from a directional process, such as evaporation, on the patterned lift-off mask and on exposed areas of the semiconductor substrate. The device is then soaked in solvents that "lift off" the patterned lift-off mask and overlying metal layers, while leaving metal not formed on the lift-off mask on the semiconductor substrate to form the wiring. In another conventional approach for fabricating front wiring, metal is selectively deposited by electrolysis (also referred to herein as electroplating), in areas of the substrate that are exposed through the patterned mask, but not on the patterned mask itself. The patterned mask can then be removed and the selectively deposited metal remains as the conductive wiring.

Other known processes for forming front wiring include first blanket depositing a metal layer using any suitable process, such as by evaporation or electroplating, and then patterning the metal layer using well known photolithographic techniques. Such photolithographic techniques can include depositing and developing a photoresist layer to form a pattered photoresist on the metal layer. The metal layer can then be patterned by removing the areas of the metal not protected by the patterned photoresist using well known etching processes. Following etching, the patterned photoresist is then removed to leave the patterned metal wiring on the substrate.

The processes described above for forming front wiring on solar cells include the formation of a photoresist pattern. As is well known in the art, forming such a photoresist pattern generally involves exposing the photoresist to radiation through a photomask. Such photomasks require much time and expense to fabricate, and are repeatedly used to form essentially the same photoresist patterns to mass produce many thousands or millions of the same solar cell devices. Because the photomasks are not easily modified, the photoresist pattern cannot be readily modified to fabricate different front wiring patterns for individual devices.

A process that can allow for modification of front wiring on solar cells and other films based on the inconsistencies of a particular semiconductor substrate would be a valuable step forward in the art.

SUMMARY

The present disclosure is directed to a method of processing a solar cell device. The method comprises detecting at least one inconsistency at a surface of a semiconductor substrate having a solar cell active region formed therein. A deposition pattern is determined based on the location of the at least one inconsistency. A material is selectively deposited on the substrate according to the deposition pattern.

The present disclosure is also directed to a solar cell device. The solar cell device comprises at least one inconsistency at a surface of a semiconductor substrate having a solar cell active region formed therein. A conductive line is configured to avoid the at least one inconsistency.

The present disclosure is further directed to a solar cell device. The solar cell device comprises at least one inconsistency at a surface of a semiconductor substrate having a solar cell active region formed therein. A front wiring is on the surface of the semiconductor substrate for collecting electrical current produced by the solar cell device. The front wiring comprises a conductive line positioned over one or more of the at least one inconsistencies. The solar cell device further comprises a patterned insulating layer separating the conductive line from the one or more inconsistencies.

It is to be understood that both the foregoing general description and the following detailed description are exemplary and explanatory only and are not restrictive of the present teachings, as claimed.

BRIEF DESCRIPTION OF THE DRAWINGS

The accompanying drawings, which are incorporated in and constitute a part of this specification, illustrate aspects of the present teachings and together with the description, serve to explain the principles of the present teachings.

Figure 1:
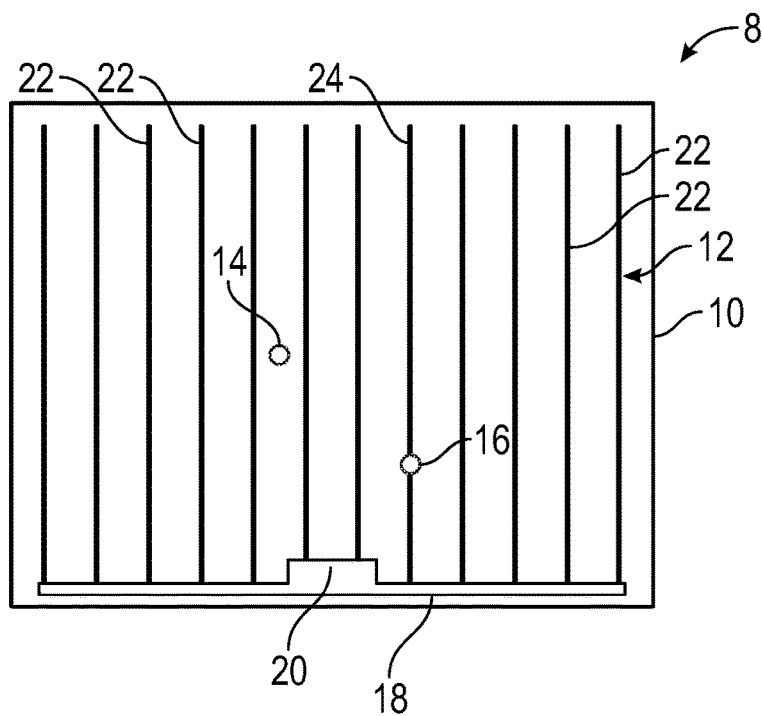
FIG. 1 shows a top view of a conventional wiring scheme implemented on a solar cell device.

It should be noted that some details of the figures have been simplified and are drawn to facilitate understanding rather than to maintain strict structural accuracy, detail, and scale.

DETAILED DESCRIPTION

Reference will now be made in detail to the present teachings, examples of which are illustrated in the accompanying drawings. In the drawings, like reference numerals have been used throughout to designate identical elements. In the following description, reference is made to the accompanying drawings that form a part thereof, and in which is shown by way of illustration specific examples of practicing the present teachings. The following description is, therefore, merely exemplary.

As described above, solar cells are formed using semiconductor substrates that may include surface inconsistencies. The present disclosure is directed to a method of processing a solar cell device that can ameliorate certain problems associated with forming conductive wiring on the inconsistencies. Using the method, inconsistencies on the semiconductor device are located. The conductive wiring is then formed to avoid the inconsistencies. Alternatively to, or in addition to, forming the wiring to avoid the inconsistencies, insulating layers can be used to encapsulate and/or fill the inconsistencies prior to forming the wiring, thereby separating the wiring from the inconsistencies. The disclosed methods can allow for improved current gathering by the wiring on the solar cell, potentially improve device yield and/or provide for increased output power of the solar cell by modifying and/or tailoring the wiring on the solar cell device.

Figure 2:
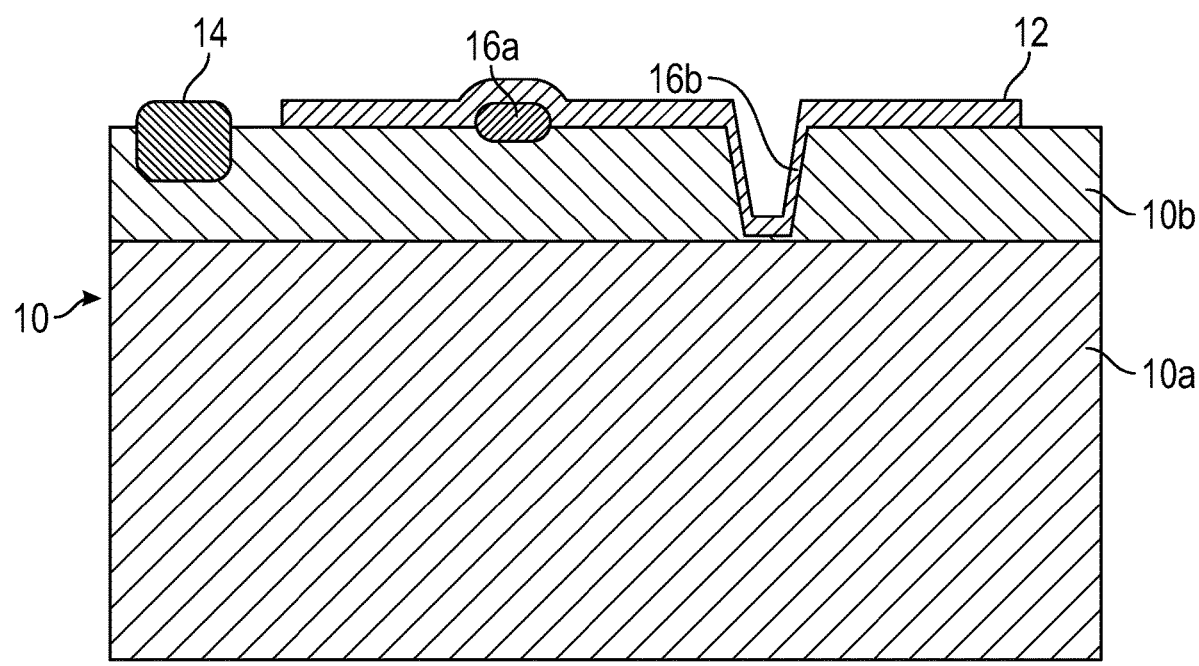
FIG. 2 illustrates a cross-sectional view of an exemplary conventional solar cell device that includes wiring formed over inconsistencies.
Figure 3:
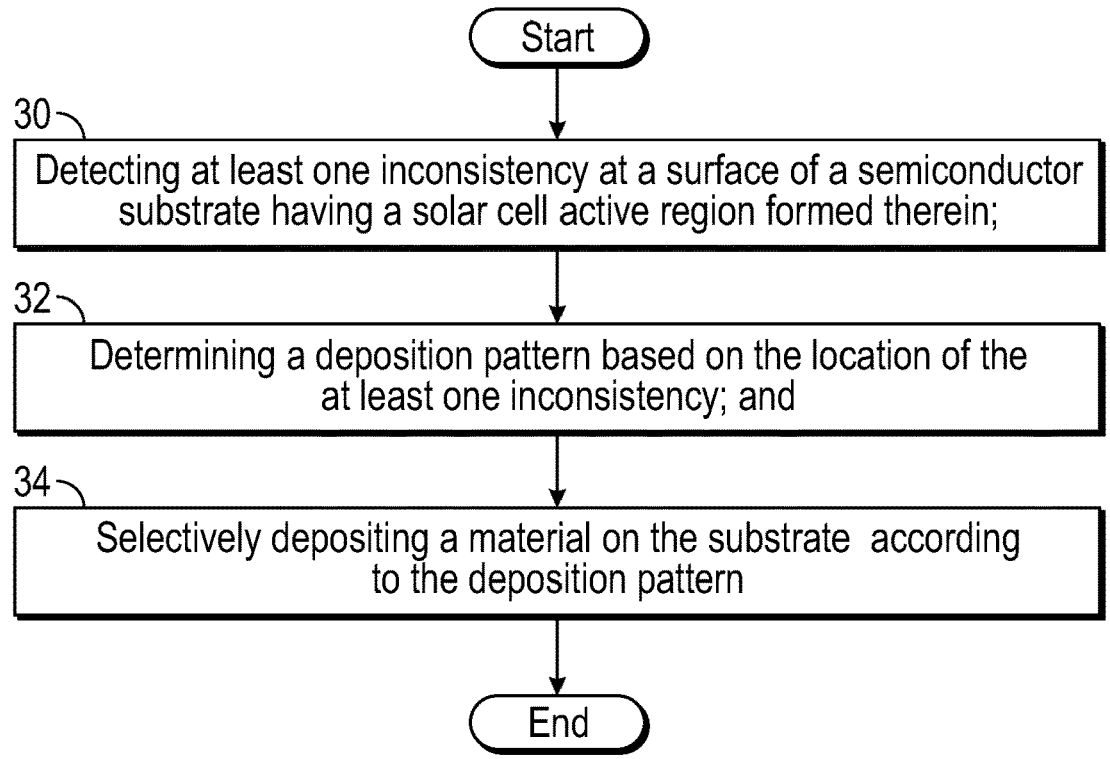
FIG. 3 shows an example process flow of a method of processing a solar cell device, according to the present disclosure

FIG. 3 shows an example process flow of the method. As indicated at process element 30 of FIG. 3, the method comprises detecting and determining the location of at least one inconsistency at a surface of a semiconductor substrate having a solar cell active region formed therein. The term "inconsistency" as used herein means any surface defect, non-planar surface feature or other surface irregularity that can cause shorting and/or increase resistance of the front wiring 12 if the front wiring 12 is formed thereon compared to the resistance of the wiring if the inconsistency were not present. Examples of such inconsistencies are discussed above with respect to FIG. 2. Techniques and apparatuses for detecting and locating inconsistencies are well known in the art and are discussed in more detail below. A deposition pattern is determined based on the location of the inconsistency, as at process element 32. Selective deposition techniques can then be employed to selectively deposit a material on the substrate according to the determined deposition pattern, as at process element 34.

Figure 4:
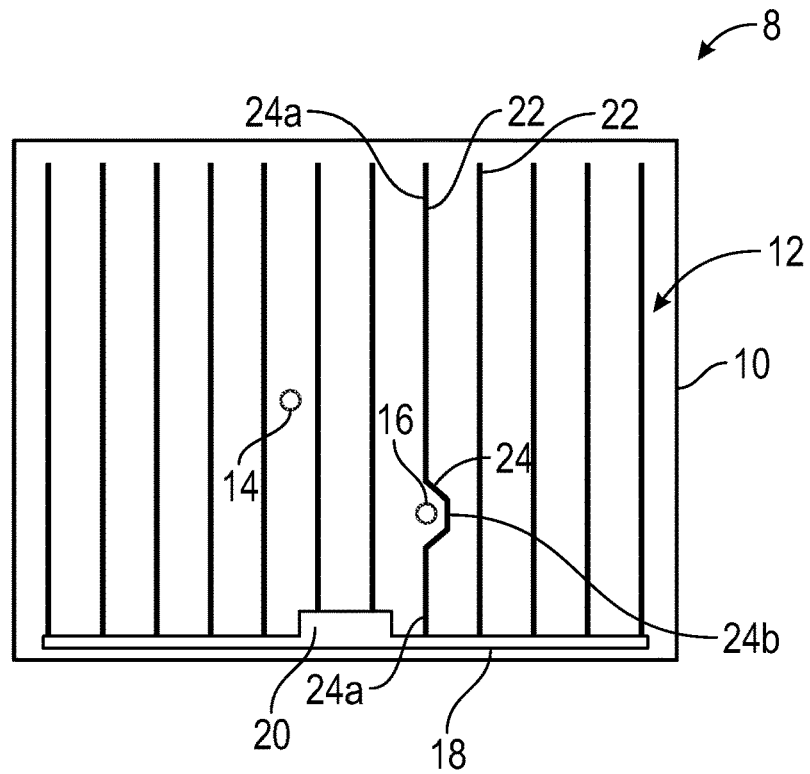
FIG. 4 shows a top view of an example deposition pattern in which the initial wiring scheme has been modified so that a conductive line avoids a inconsistency, according to the present disclosure.

Referring to FIGS. 4 and 5, semiconductor substrate 10 can comprise any semiconductor material suitable for solar cell device fabrication. For example, the semiconductor substrate can include a support substrate 10a comprising germanium single crystal or silicon single crystal. One or more III/V single crystal materials, such as GaAs and/or InGaP, is epitaxially grown on the support substrate 10a. The III/V material can include multiple layers, such as a III/V single crystal device layer 10b comprising, for example, InGaP, in which a top solar cell is formed; and a III/V single crystal cap layer 10c comprising, for example, GaAs, that can reduce contact resistance and surface recombination, as is well known in the art. The semiconductor substrate 10 can be doped with one or more n-type or p-type dopants to form at least one active region of the solar cell, which may comprise a p-n junction as is well known in the art. Exemplary active regions 64a and 64b are shown in FIG. 5, although any suitable type or number of active regions can be employed.

Referring to FIG. 4, the semiconductor substrate 10 on which the wiring scheme is to be implemented is scanned for inconsistencies 14,16. All or a portion of the semiconductor substrate 10 can be scanned. If upon scanning the semiconductor substrate a inconsistency is found, the position of the inconsistency on the semiconductor substrate 10 is determined. Detecting a inconsistency at a surface of the semiconductor substrate can be carried out using any suitable inconsistency detection system. Inconsistency detection systems are available for scanning and locating inconsistencies on semiconductor substrates. Examples of suitable detection systems include the ICOS WI-2280 Series, the Candela CSxx and CS9920 Series, the Surfscan Series all of which are made by KLA Tencor of Milpitas, Calif. Another example is the AWX™ Series made by Rudolph Technologies Inc., of Flanders, N.J.

Suitable detection systems can utilize reflected light, transmitted light, photoluminescence, electroluminescence or combinations thereof to detect inconsistencies. For photoluminescence, light emitted from the top cell of the solar cell device can potentially be used for detecting inconsistencies. For example, a GaAs cap layer can absorb the light used to excite the InGaP device layer and will absorb the photoluminescence exciting the material. The GaAs cap can be made relatively thin, such as, for example, about 5 nm to about 200 nm, to achieve photoluminescence inspection.

Differential interference contrast microscopy, also known as Nomarski interference contrast or Nomarski microscopy can also be employed during inconsistency detection to increase contrast. Differential interference contrast microscopy employs an optical microscope with polarizers arranged to have increased sensitivity to height changes on a sample, which increases contract and visibility of inconsistencies, as is well known in the art.

Referring to process element 32 of FIG. 3, determining a deposition pattern based on the location of the inconsistency can optionally comprise providing an initial wiring scheme for the solar cell device. In general, the initial wiring scheme can comprise any desired pattern for forming the wiring of a solar cell device being manufactured. As an example, an initial wiring scheme could comprise the pattern for depositing front wiring 12 on the solar cell device 8, as shown in FIG. 1. For purposes of the present disclosure, the initial wiring scheme can be provided in any suitable manner, such as a set of software instructions that are compatible for guiding a printing apparatus for purposes of selectively depositing materials to form the desired pattern for front wiring 12 on the solar cell device 8. One of ordinary skill in the art would readily be able to provide a suitable initial wiring scheme, given the present disclosure.

Using the known position of the inconsistency as determined during process element 30, it can then be determined whether implementing a portion of the initial wiring scheme on the semiconductor substrate 10 will result in a conductive line 24 that overlays the inconsistency, such as is the case with inconsistency 16 in FIG. 1. In the event it is determined that implementing a portion of the initial wiring scheme will result in a conductive line 24 that overlays the inconsistency, a modification to the initial wiring scheme can then be made that avoids the inconsistency. As discussed herein, avoiding the inconsistency can reduce the risk of shorting and or avoid an undesirable increase in resistance of the front wiring, thereby potentially providing for improved current gathering by the wiring on the solar cell, improved device yield and/or increased output power of the solar cell.

FIG. 4 shows an example deposition pattern in which the initial wiring scheme for front wiring 12 of FIG. 1 has been modified so that conductive line 24 avoids inconsistency 16. In this example, the modified wiring scheme comprises a conductive line 24 that circumvents the inconsistency so that the conductive line 24 is positioned proximate to, but not over, the inconsistency. The term "proximate to" in the context of positioning a conductive line to avoid a inconsistency is defined herein to be any distance that will cause the conductive line to avoid the inconsistency while not overlapping adjacent conductive lines. For example, the conductive line can be positioned so that at its closest point to the inconsistency, it is positioned at a distance of from 0.001 microns to 5 microns from the inconsistency, such as 0.01 microns to 2 microns. The modification can be made to any portion of the initial wiring scheme that may be positioned on a inconsistency, such as bus bar 18, contact region 20 or a grid line 22, all of which may be referred to herein as a conductive line 24. While the deposition pattern can be determined as described above, any other suitable technique for determining a deposition pattern that avoids the inconsistencies can be employed.

After determining the deposition pattern, any suitable selective deposition techniques can be used to deposit a material on the semiconductor substrate using the deposition pattern as a guide. The term "on" as used herein does not require direct physical contact and thus allows for intervening layers between the semiconductor substrate and the deposition pattern formed on the semiconductor substrate. Further, anytime the term "on" is employed herein to describe a relationship between layers, direct physical contact is contemplated as a possible option. The term "directly on" is defined to mean that direct physical contact is made.

As one example of selectively depositing material, the conductive wiring itself is selectively deposited on the semiconductor substrate 10 in the determined deposition pattern. Alternatively, a mask pattern can be selectively deposited and used to form the conductive lines in the desired deposition pattern.

In the case of selectively depositing the wiring, any suitable conventional or later developed method for selectively depositing conductive lines can be employed. For example, a conductive ink can be selectively deposited to form conductive lines using an inkjet print head, as is well known in the art. Still other techniques are known for selectively depositing various conductive materials, including micro- or nano-sized materials that may be dry, in a paste, suspended in a liquid, or are a liquid.

The resulting conductive lines can comprise any suitable conductive material, such as one or more metals selected from aluminum, gold, silver, copper and nickel, which can be selectively deposited. The use of the term "comprise" here is meant to include both pure or substantially pure materials, such as the metals listed, or alloys of any of these materials (e.g., aluminum alloys, gold alloys, silver alloys or copper alloys), as well as multi-layer metal structures, that are suitable for front wiring of a solar cell. Examples of alloys of these metals that are suitable for solar cell wiring are well known in the art. These metals and their alloys provide for low resistance of the front wiring and/or good adhesion to the substrate, as is well known in the art. An example of a multi-layer structure for conductive line 24 can comprise a relatively thin adhesion layer comprising a conductive material that adheres well to the substrate, such as a nickel or nickel alloy layer. The adhesion layer can be, for example, 0.01 micron to 1 micron in thickness. A thicker metal conductive material, such as aluminum, gold, silver, copper or alloys of any of these materials, can be deposited on the adhesion layer. The thicker metal layer forms the bulk of the conductive line 24 and can be, for example, 1 micron to 100 microns thick. Such adhesion layers provide improved adhesion of the conductive line 24 to the semiconductor substrate 10. Multi-layer conductive lines 24 can also optionally include one or more additional layers, such as a diffusion barrier to prevent mixing of the metal that can potentially degrade the conductive line, a contact layer at the metal/semiconductor junction to provide low resistance contact between the conductive line and the semiconductor substrate and a capping layer on top of the conductive line to promote connections to external conductors by limiting oxidation and/or controlling roughness. Adhesion layers, diffusion layers, contact layers, and capping layers are generally well known in the art for use in conductive lines. In a specific example, the conductive line 24 can include a first layer comprising nickel at the semiconductor substrate/conductive line interface that is relatively thin (e.g., 0.01 micron to 1 micron, such as 0.1 micron) and that acts as a contact layer, diffusion barrier and adhesion layer, a conducting layer that can comprise, for example, aluminum, copper or silver that is relatively thick (e.g., 1 micron to 100 microns, such as 6 microns) on the nickel layer; and a capping layer on the conducting layer, the capping layer comprising, for example gold that can be relatively thin compared to the conducting layer (e.g., 0.01 microns to 1 micron, such as 0.1 micron). Any of the conductive lines described in this disclosure can comprise any of the conductive materials set forth in this paragraph, and may optionally include one or more layers selected from an adhesion layer, diffusion layer, contact layer and capping layer.

Figure 5A:
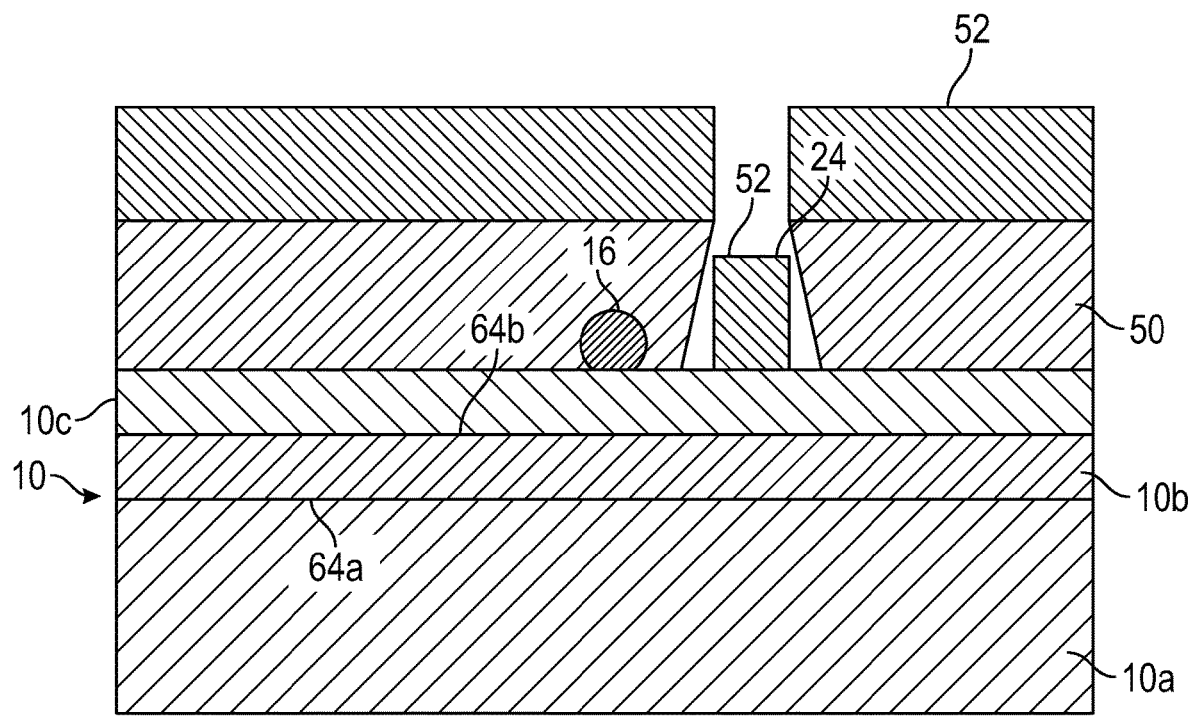
FIG. 5A shows a cross-sectional view of one example of such a patterned mask that covers a inconsistency so that a subsequently deposited conductive line is deposited proximate to, but not in contact with, the inconsistency, according to the present disclosure.

Referring to FIG. 5A, another example of selectively depositing the material comprises selectively depositing a patterned mask 50 that is then used to form the front wiring 12 in a desired pattern on the semiconductor substrate 10. Any suitable type of selectively deposited mask can be employed as patterned mask 50. Techniques for selectively depositing such masks are well known in the art. Patterned mask 50 can comprise any suitable polymer materials, such as polyamides, polyimides, or photoresist. Patterned mask 50 can be deposited using a printing process, such as inkjet printing, that selectively deposits that mask material in a pattern on the semiconductor substrate 10. FIG. 5 shows one example of a lift-off process employing a patterned mask 50 that covers one or more inconsistencies, such as the inconsistency 16, so that subsequently deposited conductive line 24 is deposited proximate to, but not in contact with, the inconsistency. A metal layer 52 is then deposited over both the patterned mask 50 and on the areas of the underlying substrate not protected by the patterned mask 50. An optional adhesion layer (not shown) can be formed prior to forming metal layer 52 on semiconductor substrate 10, as described in detail above. Conductive line 24 is then formed by removing the patterned mask 50 along with the portions of metal layer 52 that are formed thereon from the semiconductor substrate. Portions of the metal layer 52 and, if deposited, the optional adhesion layer, that are not deposited on the patterned mask 50 remain as the patterned wiring, which includes conductive line 24.

Figure 5B:
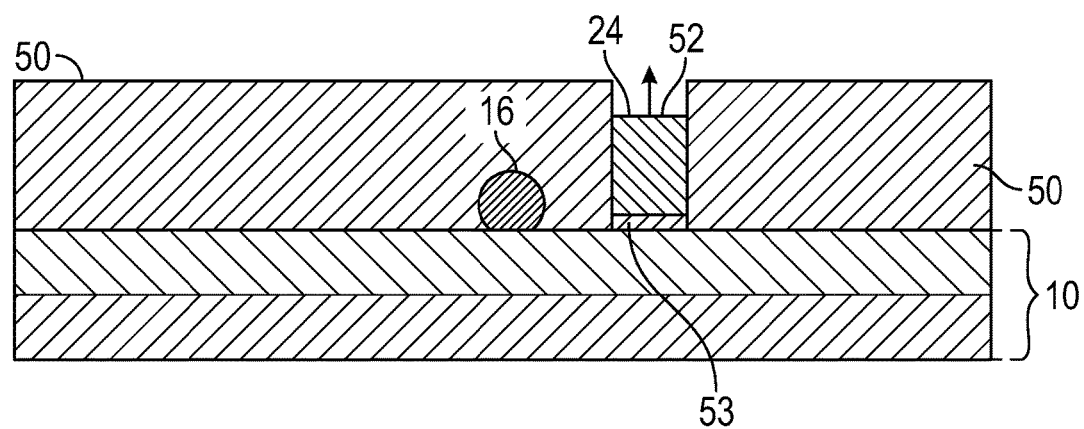
FIG. 5B shows a cross-sectional view of one example of such a patterned mask that covers a inconsistency so that a subsequently deposited conductive line is deposited proximate to, but not in contact with, the inconsistency, according to the present disclosure.

FIG. 5B illustrates an alternative process that is similar to the lift-off process described above, except that metal layer 52 is not deposited over the entire patterned mask 50, but instead is selectively deposited only on or around portions of the semiconductor substrate 10 that are not protected by the patterned mask 50. In this process, the patterned mask 50 can be selectively deposited as described above in the lift-off process of FIG. 5A, so that the mask covers one or more inconsistencies, such as inconsistency 16. After forming patterned mask 50, the metal layer 52 can be deposited using any suitable selective deposition technique, such as an electroplating process or by selectively printing metal inks using, for example, an inkjet type printer. An optional adhesion layer 53, as described above, is also shown, and may be deposited by any suitable selective deposition technique, which may be the same or different than the process used to selectively deposit metal layer 52. The electroplating process is potentially capable of forming the metal layer 52 and the optional adhesion layer 53 only in areas of the substrate not protected by the patterned mask 50. The metal ink printing process, on the other hand, may deposit metal layer 52 and the optional adhesion layer 53 in areas of the substrate not protected by patterned mask 50, and optionally on portions of the patterned mask 50 surrounding the areas that are not protected. The patterned mask 50 can then be removed, along with any metal layer 52 and the optional adhesion layer 53 that may have been formed thereon. Thus, the patterned mask can be used to control the dimension of a metal grid deposited by selective deposition processes such as electrolysis or a metal ink deposition process. After removing the patterned mask 50, a remaining portion of metal layer 52 and optional adhesion layer 53 on the semiconductor substrate 10 forms the conductive line 24. In this manner, the conductive line 24 can be routed around any inconsistencies on the semiconductor substrate 10. As discussed above, avoiding the inconsistency can reduce the risk of shorting and/or avoid an undesirable increase in resistance of the wiring, thereby potentially providing for improved current gathering by the wiring on the solar cell, improved device yield and/or increased output power of the solar cell.

Figure 6A:
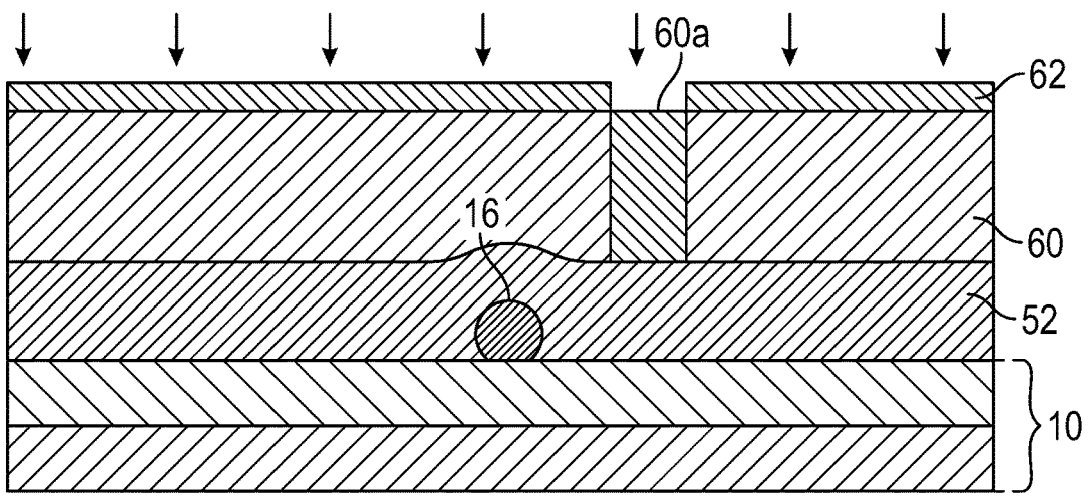
FIGS. 6A, 6B and 6C illustrate an example of a method of patterning a metal layer using selective deposition of a mask, according to the present disclosure.
Figure 6B:
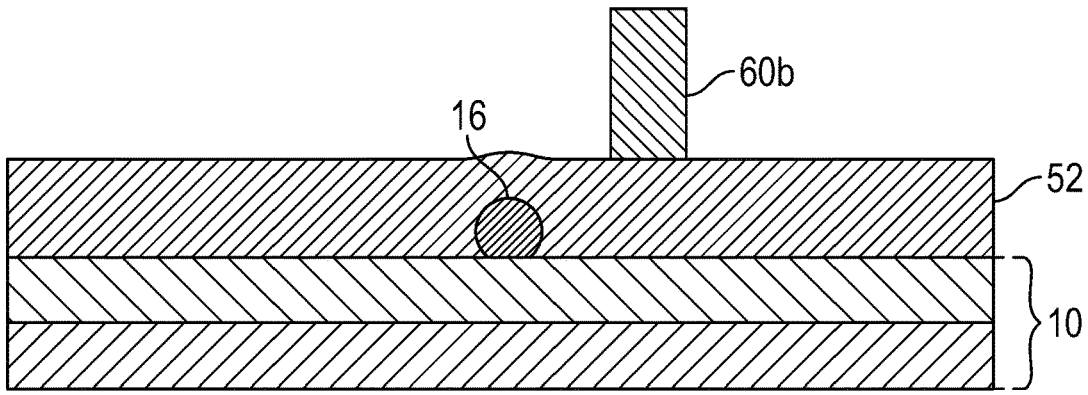
Figure 6C:
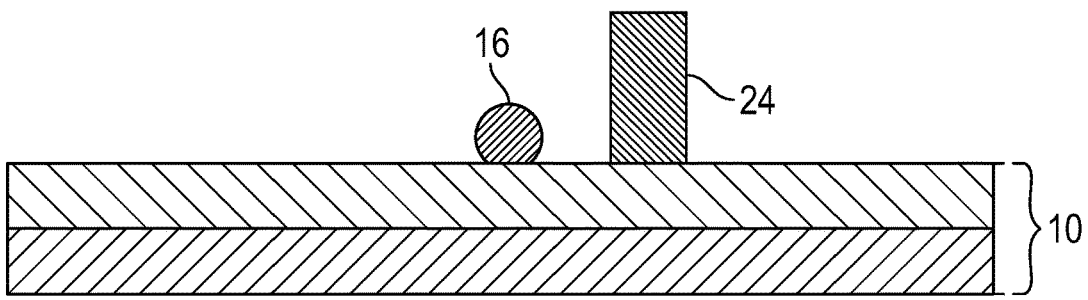

A process illustrated by FIGS. 6A to 6C is yet another example of a method of patterning a metal layer 52 by selectively depositing a mask. As part of the process, a photoresist layer 60 is blanket deposited over the semiconductor substrate 10, as shown in FIG. 6A. Then a patterned radiation mask 62 is selectively deposited over the photoresist layer 60. As described below, the patterned radiation mask 62 can be used to selectively expose portions of the photoresist layer 60 to radiation, and thus can take the place of a conventional photomask in a photolithographic process. However, unlike a conventional photomask, the patterned radiation mask 62 can be varied for each device that is fabricated. Thus, the patterned radiation mask 62 can be selectively deposited in a unique deposition pattern that results in a wiring configuration that avoids the inconsistency 16, as shown in FIG. 6C.

In this method, and any of the other methods for depositing wiring patterns disclosed herein, the inconsistencies are only an issue if they are beyond the tolerances established by engineering, as would be understood by one of ordinary skill in the art. Thus, for example, the processes of the present disclosure can optionally include determining whether detected inconsistencies are within tolerance and thus not likely to cause wiring problems, or outside of tolerance and therefore a potential cause of shorting or increased resistance, as described herein. If it is determined that an inconsistency is within tolerance, there may be no reason to adjust the deposition pattern to avoid the inconsistency and the wiring pattern can be formed in contact with the inconsistency. If, on the other hand, the inconsistency is outside of established tolerances, the inconsistency can be avoided using any of the processes described herein.

After selectively depositing the patterned radiation mask 62, areas of the photoresist layer 60 not protected by the patterned radiation mask 62 are then exposed to radiation, as illustrated by the arrows in FIG. 6A, to form a latent photoresist pattern 60a. The photoresist layer 60 is then developed using chemical processing to form photoresist pattern 60b, as illustrated in FIG. 6B. Any suitable conventional or later developed techniques for depositing and developing the photoresist mask can be employed.

The portions of the metal layer 52 not protected by photoresist pattern 60b can then be etched using conventional or later developed etching techniques to provide a wiring configuration comprising the conductive line 24. As described herein, conductive line 24 can be patterned so as to be proximate to, but not in contact with, the inconsistency 16. In an alternative process, the selectively patterned radiation mask 62 can be employed to pattern the patterned mask 50 used in the processes described herein with respect to FIGS. 5A and 5B. In the processes described herein with respect to FIGS. 6A, 6B and 6C, an optional adhesion layer can also be formed prior to forming metal layer 52 on semiconductor substrate 10, as described in detail above.

Referring back to FIG. 6A, the patterned radiation mask 62 can comprise any material that can be selectively deposited and that can effectively block the radiation used to expose the photoresist layer 60. For example, the patterned radiation mask 62 can comprise a black ink, or other colored ink, that can block the radiation used for exposing the photoresist layer 60.

Figure 7A:
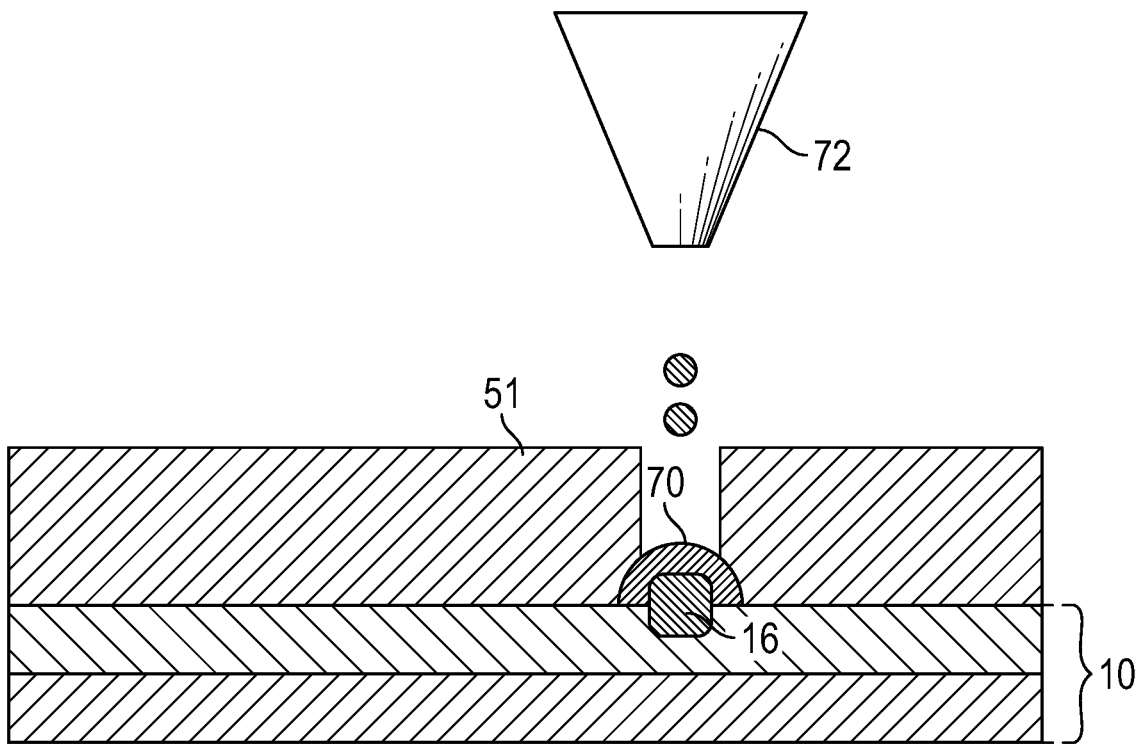
FIGS. 7A and 7B illustrate a process for selectively depositing an insulating material on a inconsistency, according to the present disclosure.
Figure 7B:
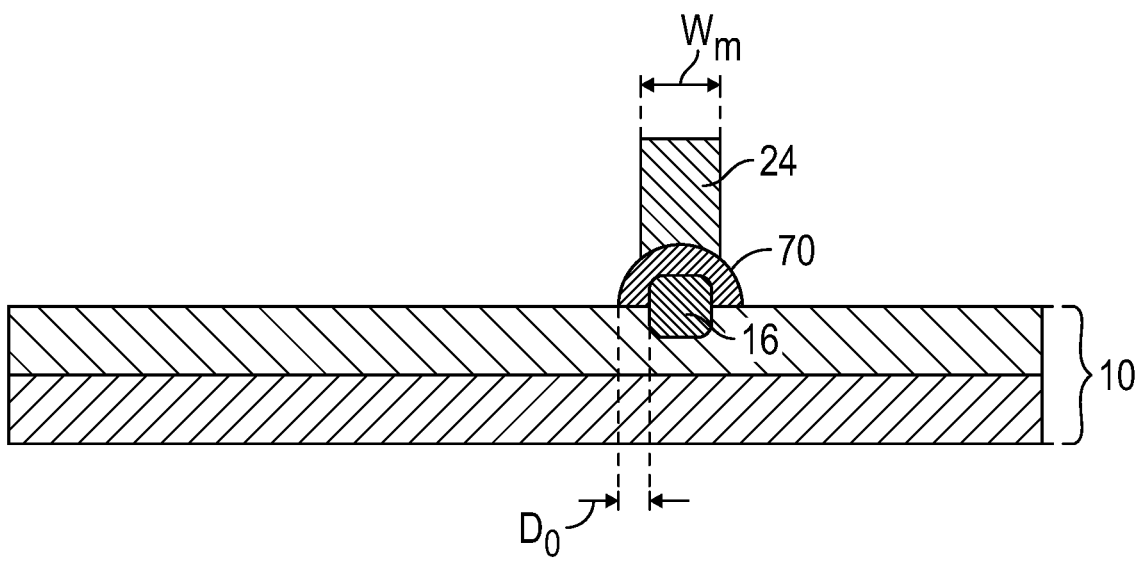
Figure 8:
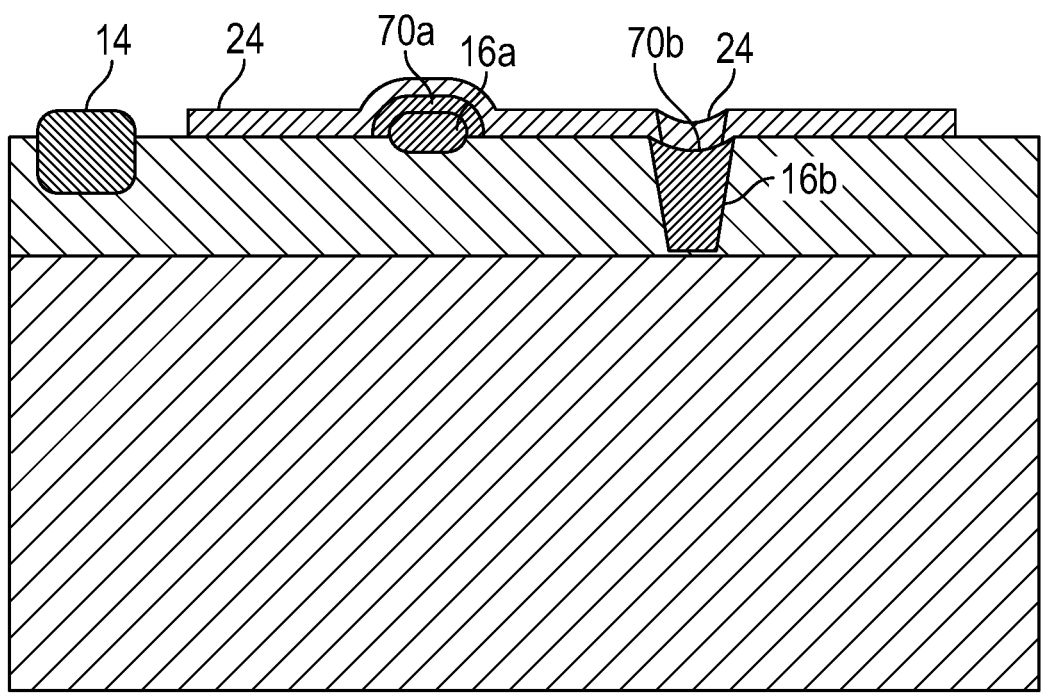
FIG. 8 illustrates a cross-sectional view of a solar cell device that comprises a patterned insulating layer positioned over inconsistencies, according to the present disclosure.

In another example, the process elements of determining a deposition pattern and selectively depositing the material, as referred to in process elements 32 and 34 (FIG. 3) can respectively comprise determining a deposition pattern for an insulating material to be formed on the inconsistency 16 and then selectively depositing an insulating layer 70 on the inconsistency 16. Such an example is illustrated in FIGS. 7A, 7B and 8. By depositing the insulating layer 70 on the inconsistency 16, the inconsistency can be made suitable for forming wiring thereon without substantially degrading device performance. Any suitable insulating material that can be selectively deposited can be employed. As one example, the insulating layer can comprise at least one material chosen from an electrically insulating polymer and an oxide ceramic, which materials are capable of electrically insulating an inconsistency from the front wiring. Further, the insulating layer 70 can be deposited in any suitable manner. For example, a print head 72, such as is used in inkjet technology, can be employed to selectively deposit the insulating material. The insulating layer 70 can be deposited to cover the entire inconsistency, thereby encapsulating the inconsistency 16 to prevent physical contact with the conductive line subsequently formed thereon. Alternatively, only a portion of the inconsistency 16 on which a subsequently deposited conductive line is to be formed may be covered by insulating layer 70. Employing the insulating layer 70 as described here is another method for avoiding contact of the front wiring with the inconsistency, which can reduce the risk of shorting and/or avoid an undesirable increase in resistance of the wiring, thereby potentially providing for improved current gathering by the wiring on the solar cell, improved device yield and/or increased output power of the solar cell.

After insulating layer 70 is deposited to encapsulate the inconsistency, any of the processes described above for forming the conductive line 24 can optionally be carried out. The conductive line 24 can be routed around the inconsistency, such as in the processes described above with respect to FIG. 5A or 5B, which may further reduce the risk that the any non-planar surface topography caused by the inconsistency will increase the resistance of the front wiring compared to the resistance if the inconsistency were not present.

Alternatively, the insulating layer 70 can be deposited either before or after a patterned photoresist mask 51 (shown in FIG. 7A) is formed as part of a lift-off process for forming a conductive line 24. The patterned photoresist mask 51 can be formed in a desired pattern using a conventional photomask to expose the photoresist layer, so that the inconsistency 16 is not covered by the patterned photoresist mask 51, as shown in FIG. 7A. A metal layer 52 is then blanket deposited, as described above in FIG. 5A, followed by removal of the photoresist and the portion of metal layer 52 formed thereon to form conductive line 24, as shown in FIG. 7B. In this lift-off process, even though the metal layer is formed over the inconsistency, the insulating layer 70 can reduce or prevent undesired effect on the device that may otherwise be caused by forming the conductive line 24 directly on the inconsistency 16. In the processes described in connection with FIGS. 7A, 7B and 8, an optional adhesion layer can be formed as part of forming conductive line 24, as described in detail above.

The processes described herein can be carried out using an apparatus for detecting the inconsistencies and a separate apparatus for selectively depositing material. Such a process can include scanning the semiconductor substrate to locate inconsistencies. Then after the entire scanning process of the semiconductor substrate is complete, a separate apparatus is employed to selectively deposit material based on the location of the inconsistencies.

Figure 9:
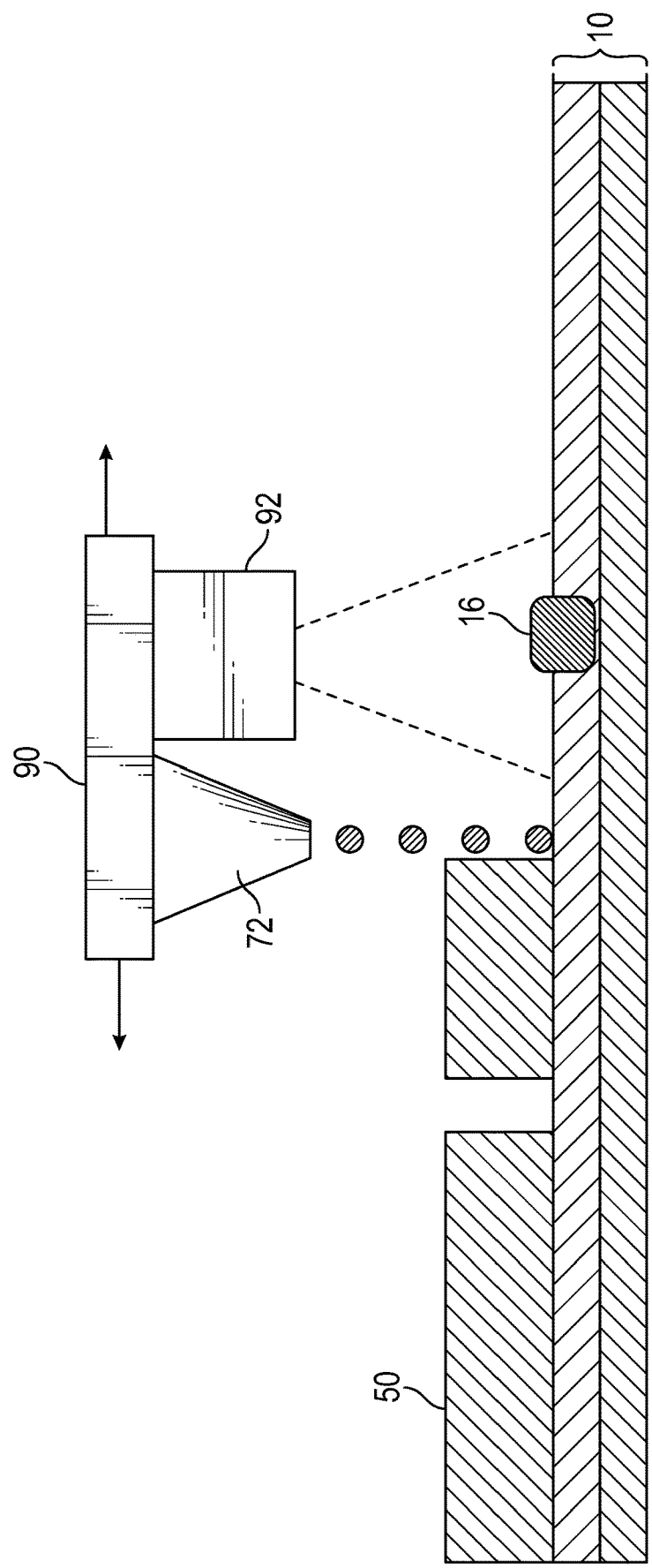
FIG. 9 illustrates a schematic view of an apparatus comprising a print head for selective deposition that is integrated on the same scan head as an inspection device that is used for detecting inconsistencies, according to the present disclosure.

Alternatively, a single apparatus can be used for both detecting inconsistencies and selective deposition. An example of such an apparatus is illustrated in FIG. 9, which shows a print head 72 for selective deposition that is integrated on the same scan head 90 as an inspection device 92 that is used for detecting inconsistencies. There can be advantages of using the same apparatus for both detecting the inconsistency and selectively depositing the material on the semiconductor substrate 10. For instance, the integrated arrangement shown in FIG. 9 can potentially improve the precision and/or accuracy of the print head 72 for depositing material so as to avoid or encapsulate inconsistencies, which can potentially have sizes on the order of microns or even nanometers.

This disclosure is also directed to a solar cell device, examples of which are illustrated in FIGS. 4 and 6C. The solar cell device comprises at least one inconsistency at a surface of a semiconductor substrate 10 having a solar cell active region formed therein. The inconsistency 16 can be any type of inconsistency, including any of the inconsistencies described herein. A conductive line 24 is configured to avoid the inconsistency. The phrases "configured to avoid the inconsistency" or "configured to avoid the at least one inconsistency" are defined herein to mean that the path of the conductive line 24 deviates from either a linear path of the conductive line or from an overall regular pattern of the metallization that would cause the conductive line to come into contact with an inconsistency in order to avoid the inconsistency. As shown in the conventional example of FIG. 1, the front wiring 12 of a solar cell device 8 is generally formed in a regular pattern that may include, for example, regularly spaced grid lines 22, although other regular patterns with linear or non-linear grid lines could also be employed. Referring to FIG. 4, in one example of the devices of the present disclosure, the conductive line (e.g., grid line or bus bar) comprises a major portion 24a that is substantially linear (e.g., it has a linear, longitudinal axis that extends for 50% or more if its length). The conductive line 24 further comprises a minor portion 24b where, if the conductive line were to remain substantially linear (e.g., continue to follow the major longitudinal axis), would cause the minor portion 24b of the conductive line 24 to intersect the inconsistency 16. The minor portion 24b deviates from the substantially linear path of the major portion 24a (e.g., the conductive line deviates so that it is no longer positioned along the longitudinal axis of major portion 24a) so as to avoid the inconsistency 16. This allows the minor portion of the conductive line to be positioned proximate to, but not over, the inconsistency, as shown, for example, in FIG. 4. The conductive line 24 can comprise any metal or conductive material that is suitable for solar cell wiring, including any of the metals or other conductive materials described herein. The conductive line 24 may comprise an optional adhesion layer, as also described herein.

This disclosure is also directed to a solar cell device as shown, for example, in FIG. 8. The solar cell device comprises at least one of inconsistencies 14, 16a and 16b, at a surface of a semiconductor substrate 10 having a solar cell active region formed therein. A patterned insulating layer 70a, 70b is positioned over the one or more inconsistencies 16a and 16b. In an example, the insulating layer is formed only in discrete areas over and optionally surrounding the inconsistencies. The insulating layer 70 can be a permanent part of the solar cell device. In one example where the inconsistency 16b is a hole in the semiconductor substrate 10, the patterned insulating layer 70b at least partially fills the hole. In another example where the inconsistency 16a is a particle, the patterned insulating layer 70a encapsulates the particle. In another example, the insulating layer 70 may be formed only on, or substantially only on, areas of the substrate over which a conductive line 24 will be formed and that have inconsistencies, such as between an inconsistency and a bus bar, contact region or a grid line. The term "substantially only on" as used here is defined to mean that the insulating layer extends out a lateral distance, $D_o$, (FIG. 7B) from the metallization by an amount that is no greater than 50% of the width dimension, $W_m$, of the metallization at the point at which the insulating layer is located. The conductive line 24 illustrated in FIG. 8 can comprise any metal or conductive material that is suitable for solar cell wiring, including any of the metals or other conductive materials described herein. The conductive line 24 may comprise an optional adhesion layer, as also described herein.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." Further, in the discussion and claims herein, the term "about" indicates that the value listed may be somewhat altered, as long as the alteration does not result in nonconformance of the process or structure to the intended purpose described herein. Finally, "exemplary" indicates the description is used as an example, rather than implying that it is an ideal.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompasses by the following claims.

What is claimed is:

1. A method of processing a solar cell device, the method comprising:
   detecting at least one inconsistency at a surface of a semiconductor substrate having a solar cell active region formed therein;
   determining a deposition pattern based on a location of the at least one inconsistency; and
   selectively depositing a material on the substrate according to the deposition pattern;
   wherein selectively depositing the material comprises selectively depositing a conductive line configured to avoid the at least one inconsistency, the conductive line forming a portion of a front wiring on the solar cell device;
   wherein the conductive line comprises a major conductive portion and a minor conductive portion that deviates from the major conductive portion, the major conductive portion comprising a first part on a first side of the at least one inconsistency and a second part on a second side of the at least one inconsistency that is opposite the first side, the minor conductive portion electrically connecting the first part and the second part; and
   wherein the conductive line is positioned proximate to, but not over, the at least one inconsistency.

2. The method of claim 1, wherein determining a deposition pattern based on the location of the at least one inconsistency comprises:
   providing an initial wiring scheme for the solar cell device;
   determining that implementing a portion of the initial wiring scheme will result in an initial conductive line that overlays the inconsistency; and
   determining a modified wiring scheme that avoids the at least one inconsistency.

3. The method of claim 1, wherein the conductive line comprises one or more metals selected from aluminum, gold, silver, copper and nickel.

4. The method of claim 1, wherein selectively depositing the material comprises selectively depositing a patterned mask.

5. The method of claim 4, further comprising depositing the conductive line on areas of the substrate not protected by the patterned mask, the conductive line being selectively deposited by electroplating.

6. The method of claim 4, further comprising depositing the conductive line on areas of the substrate not protected by the patterned mask, the conductive line being selectively deposited by a metal ink deposition process, wherein the patterned mask controls a dimension of the conductive line.

7. The method of claim 4, wherein the patterned mask covers the at least one inconsistency.

8. The method of claim 7, further comprising depositing a metal layer over the patterned mask and then removing the patterned mask from the semiconductor substrate to pattern the metal layer.

9. The method of claim 1, further comprising depositing a photoresist layer over the semiconductor substrate, wherein selectively depositing the material comprises selectively depositing a patterned radiation mask over the photoresist layer.

10. The method of claim 9, further comprising exposing the photoresist layer and the patterned radiation mask to radiation and developing the photoresist layer to form a photoresist pattern.

11. The method of claim 1, wherein selectively depositing the material comprises selectively depositing an insulating layer over the at least one inconsistency.

12. The method of claim 11, wherein the insulating layer comprises at least one material chosen from an electrically insulating polymer and an oxide ceramic.

13. The method of claim 1, wherein both detecting the at least one inconsistency and selectively depositing the material on the substrate are carried out using a single apparatus.

14. A method of processing a solar cell device, the method comprising:
- detecting at least one inconsistency at a surface of a semiconductor substrate having a solar cell active region formed therein;
- determining a deposition pattern based on a location of the at least one inconsistency,
  - wherein determining the deposition pattern comprises:
    - providing an initial wiring scheme for the solar cell device;
    - determining that implementing a portion of the initial wiring scheme will result in
      - an initial conductive line that overlays the inconsistency; and
    - determining a modified wiring scheme that avoids the at least one inconsistency; and
- selectively depositing a material on the substrate according to the deposition pattern;
- wherein selectively depositing the material comprises selectively depositing a conductive line configured to avoid the at least one inconsistency, the conductive line forming a portion of the modified wiring scheme;
- wherein the conductive line comprises a major conductive portion and a minor conductive portion that deviates from the major conductive portion, the major conductive portion comprising a first part on a first side of the at least one inconsistency and a second part on a second side of the at least one inconsistency that is opposite the first side, the minor conductive portion electrically connecting the first part and the second part; and
- wherein the conductive line is positioned proximate to, but not over, the at least one inconsistency.

15. The method of claim 14, wherein selectively depositing the material comprises selectively depositing a patterned mask.

16. The method of claim 14, further comprising depositing a photoresist layer over the semiconductor substrate, wherein selectively depositing the material comprises selectively depositing a patterned radiation mask over the photoresist layer.

17. The method of claim 14, wherein selectively depositing the material comprises selectively depositing an insulating layer over the at least one inconsistency.

18. The method of claim 15, further comprising depositing the conductive line on areas of the substrate not protected by the patterned mask, the conductive line being selectively deposited by electroplating.

19. The method of claim 15, further comprising depositing the conductive line on areas of the substrate not protected by the patterned mask, the conductive line being selectively deposited by a metal ink deposition process, wherein the patterned mask controls a dimension of the conductive line.

20. The method of claim 15, wherein the patterned mask covers the at least one inconsistency.

* * * * *